(12) United States Patent
Urano et al.

(10) Patent No.: US 9,530,614 B2
(45) Date of Patent: Dec. 27, 2016

(54) CHARGED PARTICLE BEAM DEVICE AND ARITHMETIC DEVICE

(71) Applicant: HITACHI HIGH-TECHNOLOGIES CORPORATION, Tokyo (JP)

(72) Inventors: Kotoko Urano, Tokyo (JP); Tomonori Nakano, Tokyo (JP); Yoichi Ose, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/373,123

(22) PCT Filed: Dec. 17, 2012

(86) PCT No.: PCT/JP2012/082679
§ 371 (c)(1),
(2) Date: Jul. 18, 2014

(87) PCT Pub. No.: WO2013/108529
PCT Pub. Date: Jul. 25, 2013

(65) Prior Publication Data
US 2015/0060654 A1    Mar. 5, 2015

(30) Foreign Application Priority Data
Jan. 19, 2012    (JP) .................................. 2012-009353

(51) Int. Cl.
*H01J 37/28* (2006.01)
*H01J 37/153* (2006.01)
*G01Q 40/00* (2010.01)

(52) U.S. Cl.
CPC ............... *H01J 37/28* (2013.01); *G01Q 40/00* (2013.01); *H01J 37/153* (2013.01); *H01J 2237/1534* (2013.01); *H01J 2237/28* (2013.01); *H01J 2237/2809* (2013.01)

(58) Field of Classification Search
USPC ................... 250/396 R, 396 ML, 397, 398
See application file for complete search history.

(56) References Cited

U.S. PATENT DOCUMENTS 7,095,031 B2    8/2006 Uno
2009/0242786 A1*  10/2009 Yoshida et al. ........... 250/396 R

FOREIGN PATENT DOCUMENTS

| JP | 2006-114304 A | 4/2006 |
| JP | 4248387 B2 | 1/2009 |
| JP | 2011-040256 A | 2/2011 |
| WO | 2011/152303 A1 | 12/2011 |

* cited by examiner

*Primary Examiner* — Nicole Ippolito
*Assistant Examiner* — Hanway Chang
(74) *Attorney, Agent, or Firm* — Mattingly & Malur, PC

(57) ABSTRACT

It is possible to determine an optimal parasitic aberration adjustment amount even when the relationship of the parasitic aberration adjustment amount with respect to the field intensity of multiple poles changes nonlinearly. To this end, in the present invention, an aberration correction amount is computed by measuring an aberration coefficient of an optical unit of a charged particle beam device, and at the same time, the present value of a power supply control value applied to an aberration corrector is measured. Then, the parasitic aberration adjustment amount for suppressing the amount of a parasitic aberration generated in the aberration corrector is computed on the basis of the aberration correction amount and the present value of the power supply control value.

10 Claims, 10 Drawing Sheets

Fig. 4

| First-Stage Octupole Current [mA] | Amount of Current for Adjusting Parasitic Dipole Field [mA] |
|---|---|
| $o_1$ | $d_1$ |
| $o_2$ | $d_2$ |
| ⋮ | ⋮ |
| $o_{x-1}$ | $d_{x-1}$ |
| $o_x$ | $d_x$ |
| $o_{x+1}$ | $d_{x+1}$ |
| ⋮ | ⋮ |
| $o_n$ | $d_n$ |

17 Aberration Coefficients Conversion Table
18 Parasitic Aberration Adjustment Amount Table
22 Aberration Coefficients Measurement Result Memory Unit
23 Aberration Corrector Power Output Value History Memory Unit

Fig. 7

| Aberration → <br> ↓ Correction Time | Axis Deviation <br> A0 | Out-of-Focus <br> C1 | Astigmatism <br> A1 | ... | Spherical Aberration <br> C3 |
|---|---|---|---|---|---|
| 0 | $A_{00}$ | $C_{10}$ | $A_{10}$ | ... | $C_{30}$ |
| 1 | $A_{01}$ | $C_{11}$ | $A_{11}$ | ... | $C_{31}$ |
| ⋮ | ⋮ | ⋮ | ⋮ | ⋮ | ⋮ |
| n-1 | $A_{0n-1}$ | $C_{1n-1}$ | $A_{1n-1}$ | ... | $C3_{n-1}$ |
| n | $A_{0n}$ | $C_{1n}$ | $A_{1n}$ | ... | $C3_n$ |
| ⋮ | ⋮ | ⋮ | ⋮ | ⋮ | ⋮ |
| N | $A_{0N}$ | $C_{1N}$ | $A_{1N}$ | ... | $C_{3N}$ |

Fig. 8

| ↓ Correction Time | Dipole | Quadrupole | Hexapole | Octupole |
|---|---|---|---|---|
| 0 | $d_{10}$ | $q_{10}$ | 0 | 0 |
| 1 | $d_{11}$ | $q_{11}$ | 0 | $o_{11}$ |
| ⋮ | ⋮ | ⋮ | ⋮ | ⋮ |
| n-1 | $d_{1n-1}$ | $q_{10}$ | $h_{1x}$ | $o_{1n-1}$ |
| n | $d_{1n-1}$ | $q_{10}$ | $h_{1x}$ | $o_{1n}$ |
| ⋮ | ⋮ | ⋮ | ⋮ | ⋮ |
| N | $d_{1N}$ | $q_{1N}$ | $h_{1N}$ | $o_{1n}$ |

CHARGED PARTICLE BEAM DEVICE AND ARITHMETIC DEVICE

TECHNICAL FIELD

The present invention relates to a technique of automatically adjusting parasitic aberrations in a charged particle beam device having an automatic aberration corrector.

BACKGROUND ART

A scanning electron microscope (SEM), a focused ion beam (FIB) processing device, or a device that uses other types of converged charged particle beams (i.e., probe beams) observes an image of a sample and processes the sample by scanning the surface of the sample with a probe. The resolution and the processing accuracy of such charged particle beam device are determined by the size of the probe cross-section (i.e., probe diameter). In principle, the smaller the probe diameter, the higher the resolution and processing accuracy that can be achieved.

In recent years, aberration correctors for charged particle beam devices have been developed and put into practical use. For an aberration corrector, multiple stages of multipole lenses having magnetic poles or electrodes are used. In each stage, a non-rotationally symmetrical electric field or magnetic field, such as a dipole field, a quadrupole field, a hexapole field, or an octupole field, is applied to a beam in a manner superimposed thereon, so as to provide an inverse aberration to the probe beam. Accordingly, the aberration corrector cancels out a variety of aberrations, such as spherical aberrations and chromatic aberrations generated on an objective lens, a polarizing lens, or the like of an optical unit.

However, as the aberration corrector needs a large number of power supplies for the multiple poles, complicated adjustment operations are required. Thus, attempts have been made to automate aberration correction by quantifying the aberration amount of an optical unit and feeding back an inverse aberration amount thereof to the charged particle beam device (for example, Patent Literature 1).

Typically, there is a plurality of types of aberrations including third-order and lower-order aberrations. However, a field that is necessary to correct each aberration is not independent of each other. Therefore, when some type of aberration is reduced, other types of aberrations can increase. Thus, it is typically necessary to repeat feedback a plurality of times to gradually optimize all aberrations. In this specification, a series of operations (i.e., one cycle) from "measurement of an aberration" to "reflection of the measurement result into a power supply value of an aberration corrector" will be referred to as "performing aberration correction."

In the actual charged particle beam device, an aberration of an objective lens is corrected using an aberration corrector. However, as an aberration occurs due to a positional deviation of each pole of the multipole lens in the aberration corrector, variations in the magnetic properties of polar materials, and the like, there may be cases where a distribution of the generated field would deviate from the ideal field distribution of the multiple poles even when the electric field or magnetic field of the multipole lens is controlled. This in turn may generate a lower-order field, such as a dipole field or a quadrupole field.

When a charged particle beam enters a multipole lens that has a field distribution deviation with respect to the charged particle beam for some reason, the charged particle beam would be influenced by a dipole field or quadrupole field originating from the deviation, whereby the trajectory of the beam would also deviate. Consequently, an axis deviation, out-of-focus, or the like would occur, which could influence the resulting image quality. As described above, a lower-order field that is incidentally generated upon occurrence of a deviation from the ideal field when the electric field or magnetic field of an aberration corrector is changed, in particular, will be collectively referred to as a "parasitic aberration." In the following description, the term "aberration," when used alone, refers to a spherical aberration or chromatic aberration of an objective lens, and is distinguished from a "parasitic aberration" that is generated in the corrector.

The "parasitic aberration" appears as a lower-order field than the field of the multiple poles that should be originally controlled. A parasitic dipole field or a parasitic quadrupole field that can cause an axis deviation or out-of-focus, in particular, has a large influence on the resulting image. Thus, when the field of the multiple poles is changed, it would be necessary to cancel out the influence of the change by superimposing a dipole field or a quadrupole field on the field.

A parasitic aberration occurs when a generated field deviates from an ideal field. Therefore, it would be difficult to take a measure by predicting a deviation that may occur through simulation or the like before producing an aberration corrector. Accordingly, an operator should manually operate the aberration corrector and perform adjustment while checking an image of an axis deviation or out-of-focus that has occurred after changing the field of the multiple poles.

Meanwhile, in order to automate aberration correction, it is required to minimize parasitic aberrations that would be generated when the field of the multiple poles is changed in the automatic aberration correction sequence. This is because, if a charged particle beam does not reach the surface of the sample due to a significant axis deviation originating from parasitic aberrations and acquisition of an image has thus failed, or if a big out-of-focus has occurred and the image quality has thus deteriorated to such an extent that the sample cannot be identified as a result of changing the field of the multiple poles, it would be impossible to compute the magnitude of an aberration from the image and execute a continuous aberration correction sequence.

In order to address such problem, it would be necessary to move the field of the multiple poles in the actual device after producing the aberration corrector and inspect in advance a parasitic aberration that occurs at that time, and set information on the amount of a dipole field or a quadrupole field that should be adjusted to correct the aberration, on the device in advance.

A technique related to a method of correcting parasitic aberrations is disclosed in Patent Literature 2. Patent Literature 2 discloses a method of correcting a parasitic dipole field and a parasitic quadrupole field that are generated due to mechanical/electrical deviations of multiple poles.

CITATION LIST

Patent Literature

Patent Literature 1: JP 4248387 B
Patent Literature 2: JP 2006-114304 A

SUMMARY OF INVENTION

Technical Problem

Patent Literature 2 describes a method of correcting a parasitic dipole field and a parasitic quadrupole field that are generated due to mechanical/electrical deviations of multiple poles. However, the correction method described in Patent Literature 2 requires that the relationship between the field intensity of the multiple poles in the actual device and the magnitude of a field that is necessary to correct a parasitic aberration (i.e., parasitic aberration correction amount) satisfy a linear relationship or be constantly invariable. Therefore, when such a precondition is not satisfied, for example, when the relationship of the parasitic aberration correction amount with respect to the field intensity of the multiple poles cannot be expressed with a simple linear relationship, or when a variation from the linear relationship is large, it would be impossible to cancel out the influence of the parasitic aberration. In particular, for multiple poles that are formed using magnetic poles, there are cases where, when current for the poles is frequently changed in the repeated automatic correction sequences, the relationship of the parasitic aberration correction amount with respect to the field intensity of the multiple poles originating from the hysteresis properties of the material may change. In such a case, there is a possibility that a discrepancy may occur between the relationship between the field intensity of the multiple poles and the parasitic aberration correction amount stored in the device in advance and the response of the actual device, so that it may be impossible to suppress the influence of the parasitic aberrations.

The present invention provides a mechanism capable of, even when the relationship of the parasitic aberration correction amount with respect to the field intensity of multiple poles changes due to the field intensity of the multiple poles or changes with time while automatic aberration correction is performed, determining the parasitic aberration correction amount by taking the influence of the change into consideration.

Solution to Problem

An example of the present invention includes a process of computing an aberration correction amount by measuring an aberration coefficient of an optical unit of a charged particle beam device, a process of measuring the present value of a power supply control value applied to an aberration corrector, and a process of computing a parasitic aberration adjustment amount on the basis of the aberration correction amount and the present value of the power supply control value.

Another example of the present invention includes a process of computing an aberration correction amount by measuring an aberration coefficient of an optical unit of a charged particle beam device, a process of storing a measurement history of the aberration coefficient, a process of measuring the present value of a power supply control value applied to an aberration corrector, a process of storing a measurement history of the power supply control value, and a process of computing a parasitic aberration adjustment amount on the basis of the measurement history of the aberration coefficient, the measurement history of the power supply control value, and the aberration correction amount.

Advantageous Effects of Invention

According to the present invention, it is possible to, even when the relationship between the field intensity of multiple poles of an aberration corrector and a parasitic aberration adjustment amount changes nonlinearly or changes with time, correct parasitic aberrations by suppressing the influence of the change. Other problems, configurations, and advantages will become apparent from the following description of embodiments.

BRIEF DESCRIPTION OF DRAWINGS

FIG. 4 is a diagram showing an exemplary parasitic aberration adjustment amount table.

FIG. 7 is a diagram showing exemplary table data held by an aberration measurement result memory unit.

FIG. 8 is a diagram showing exemplary table data held by an aberration corrector power output value history memory unit.

DESCRIPTION OF EMBODIMENTS

Figure 1:
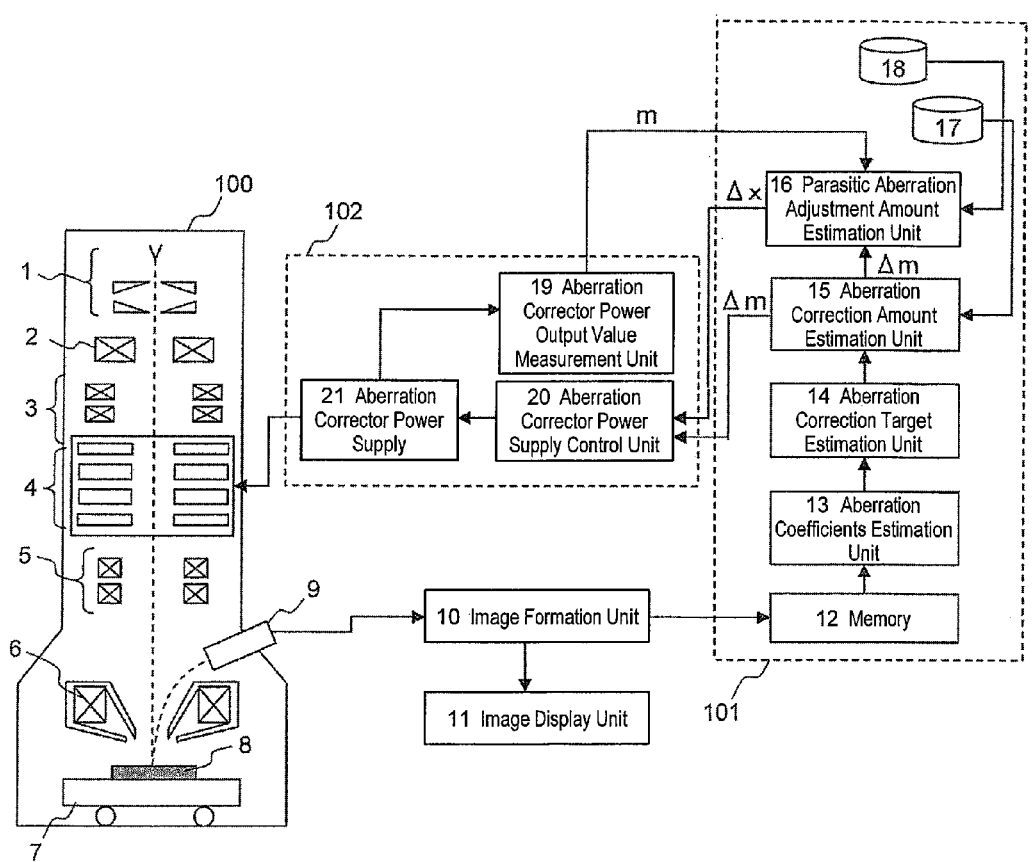
FIG. 1 is a diagram showing an exemplary configuration of a charged particle beam device system in accordance with Embodiment 1.

Hereinafter, embodiments of the present invention will be specifically described with reference to the drawings. It should be noted that members having an identical function throughout the drawings for illustrating the embodiments are denoted by identical or associated reference numerals, and thus, description of such members will be made only once. In addition, in the following embodiments, descriptions of identical or similar portions will also be made only once in principle, unless it is necessary to repeat the description.

Embodiment 1

System Configuration

FIG. 1 shows the schematic configuration of a SEM system that has an aberration corrector mounted thereon. This embodiment will describe a SEM that has mounted thereon a quadrupole to octupole-electromagnetic-field-superimposed aberration corrector, and a control system therefor.

An electron beam (which is indicated by the dotted line in FIG. 1) emitted from an electron gun 1 in a SEM column 100 enters an aberration corrector 4 after passing through a condenser lens 2 and a two-stage deflection coil 3. An electron beam that has passed through the aberration corrector 4 further passes through a scan coil 5 and an objective lens 6, and then scans the surface of a sample 8 mounted on a sample stage 7. Secondary charged particles, such as secondary electrons or reflected electrons, are emitted from a point of the sample 8 irradiated with the electron beam. The secondary charged particles are detected by a detector 9, and the detection result is output to an image formation unit 10 as a secondary charged particle signal. The image formation unit 10 is provided with processing circuits such as a signal amplifying stage and a D/A converter. The secondary charged particle signal is converted into luminance distribution data (i.e., image data) in the image formation unit 10, and is then output to an image display device 11. The image data is also provided to a control computer 101 from the image formation unit 10 to be accumulated in a memory 12.

The SEM in accordance with this embodiment has a configuration in which an electron beam, which is allowed to become incident on an object point of the objective lens 6, can be tilted with respect to the optical axis of the objective lens 6. For such a configuration, the SEM in accordance with this embodiment has the two-stage deflection coil 2 at a position above the aberration corrector 4. The deflection coil 2 can allow the central axis of an electron beam to have a tilt angle $\tau$ and an azimuth $\theta$ with respect to the optical axis of the objective lens 6.

The control computer 101 executes a process of computing the control amount for the aberration corrector 4 on the basis of the image data accumulated in the memory 12 and the present value (i.e., power output value) of the multipole control amount that is provided to each of the multiple poles of the aberration corrector 4. More specifically, the control computer 101 executes a process of computing the control amount to be provided to an aberration corrector power supply control unit 20 in an aberration corrector power supply system 102. Hereinafter, such processing operation will be described in detail.

The aberration coefficients estimation unit 13 measures aberration coefficients on the basis of the image data accumulated in the memory 12, and transfers the aberration coefficients to an aberration correction target estimation unit 14. A method of measuring aberration coefficients using image data is well known. Thus, detailed description thereof is omitted herein. The aberration correction target estimation unit 14 preferentially selects an aberration to be corrected from among the computed aberration coefficients, and provides information on the selected aberration and the aberration coefficient to an aberration correction amount estimation unit 15. The aberration correction amount estimation unit 15 refers to an aberration coefficients conversion table 17, and determines a multipole control amount (e.g., current value or voltage value) $\Delta m$ that is necessary to correct the selected aberration. The aberration coefficients conversion table 17 has stored therein the correspondence between a measured aberration coefficient and the multipole control amount $\Delta m$ for each aberration. The multipole control amount $\Delta m$ is determined as the amount of change $\Delta$ that is necessary to correct an aberration.

The multipole control amount $\Delta m$ determined by the aberration correction amount estimation unit 15 is provided to a parasitic aberration adjustment amount estimation unit 16. Further, the parasitic aberration adjustment amount estimation unit 16 is also provided with information m about the measured value (i.e., present value) of the multipole control amount for the aberration corrector 4 from an aberration corrector power output value measurement unit 19.

The parasitic aberration adjustment amount estimation unit 16 refers to a parasitic aberration adjustment amount table 18 on the basis of the information m, and determines a multipole adjustment amount (e.g., current value or voltage value) for adjusting the amount of a lower-order parasitic aberration that is newly generated as a result of providing the multipole control amount $\Delta m$ to the aberration corrector 4. The parasitic aberration adjustment amount table 18 has stored therein the correspondence between the multipole control amount and the parasitic aberration adjustment amount $\Delta x$ for each multipole lens of the aberration corrector 4 as described below. The control computer 101 outputs a value obtained by adding the parasitic aberration adjustment amount $\Delta x$ to the multipole control amount $\Delta m$ to the aberration corrector power supply control unit 20 in the aberration corrector power supply system 102, as a power supply control amount for the aberration corrector 4.

The aberration corrector power supply system 102 includes the aberration corrector power output value measurement unit 19, the aberration corrector power supply control unit 20, and an aberration corrector power supply 21.

The aberration corrector power output value measurement unit 19 has functions of measuring the present value of the control power generated by the aberration corrector power supply 21 and transmitting the measurement result as the information m to the parasitic aberration adjustment amount estimation unit 16. The presence of such feedback path is one of the characteristic configurations of the system in accordance with this embodiment. With the presence of such feedback path, the parasitic aberration adjustment amount estimation unit 16 can estimate in advance a suitable adjustment amount for a parasitic aberration that is newly generated when an aberration is corrected and can actually apply the estimated adjustment amount.

The aberration corrector power supply control unit 20 outputs a computation result of the power supply control amount received from the control computer 101 to the aberration corrector power supply 21. Herein, the aberration corrector power supply control unit 20 computes the total value of the control amount to be provided to each of the multiple poles and the adjustment amount, and outputs the total value as the computation result of the power supply control amount. The aberration corrector power supply 21 feeds back current or voltage in accordance with the power supply control amount, which has been provided as a digital value, to each of the multiple poles of the voltage aberration corrector 4. That is, the aberration corrector power supply 21 generates current or voltage to be applied to the multiple poles and applies it.

[Summary of Correction Operation]

Figure 2:
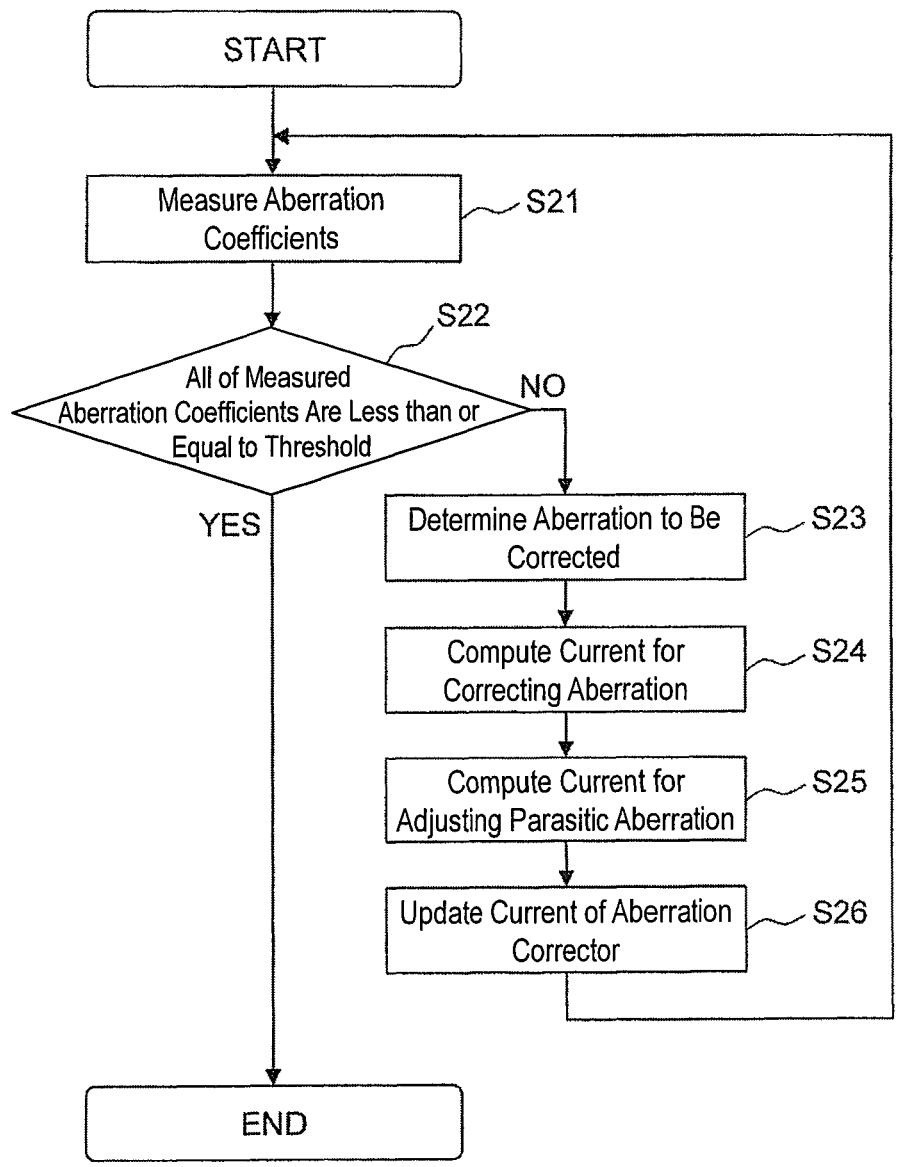
FIG. 2 is a flowchart showing a summary of an aberration correction operation in accordance with Embodiment 1.

FIG. 2 shows exemplary procedures to correct aberrations in accordance with this embodiment. The following description is based on the premise that multiples poles are formed of magnetic poles and current is used for controlling the aberration corrector 4. Needless to say, even when the multiple poles are formed of electrodes, aberrations can be corrected through similar procedures.

First, an image is acquired in the SEM column 100, and the acquired image is stored in the memory 12 in the control computer 101. The aberration coefficients estimation unit 13 reads the image written in the memory 12, and computes aberration coefficients of the optical unit (step S21).

Next, the aberration correction target estimation unit 14 determines if the aberration correction has terminated (step S22). Specifically, if each of the measured aberration coefficients is greater than or equal to a threshold is determined. The threshold herein has been determined for each individual aberration coefficient. If an aberration coefficient is smaller than the threshold, it means that correction is unnecessary. Meanwhile, if it is determined that aberration correction is necessary for any of the aberration coefficients, the aberration correction target estimation unit 14 determines the type and magnitude of an aberration that particularly has an influence on the acquired image, and provides the result to the aberration correction amount estimation unit 15 (step S23). Such determination method is also commonly known. Thus, description thereof is omitted herein.

The aberration correction amount estimation unit 15, on the basis of the type and magnitude of the aberration provided from the aberration correction target estimation unit 14, estimates which value the current value applied to which of the multiple poles in which stage of the aberration corrector 4 should be set to or changed (step S24). For estimation, the aberration coefficients conversion table 17 is referred to. The aberration coefficients conversion table 17 has recorded thereon the correspondence between an aberration coefficient and the amount of current that is necessary for the correction, for each type of aberration. The aberration correction amount estimation unit 15 determines how much current should be applied to which of the multiple poles in which stage of the aberration corrector 4 on the basis of the correspondence, and provides the result to the parasitic aberration adjustment amount estimation unit 16. The result is also provided to the aberration corrector power supply control unit 20.

The parasitic aberration adjustment amount estimation unit 16 estimates how much parasitic aberration will be generated when the amount of current for the multiple poles, which has been determined by the aberration correction amount estimation unit 15, is directly provided to the aberration corrector 4, and computes the amount of parasitic aberration adjustment current that is necessary to cancel out such parasitic aberration (step S25).

After that, the control computer 101 feeds back current, which is obtained by adding together the amount of current for the multiple poles computed in step S24 and the amount of parasitic aberration adjustment current computed in step S25, as the updated current of the aberration corrector 4, to the aberration corrector 4 via the aberration corrector power supply system 102 (step S26). Through such feedback, both the aberration and the parasitic aberration are corrected or adjusted at once.

[Adjustment of Parasitic Aberration]

Figure 3:
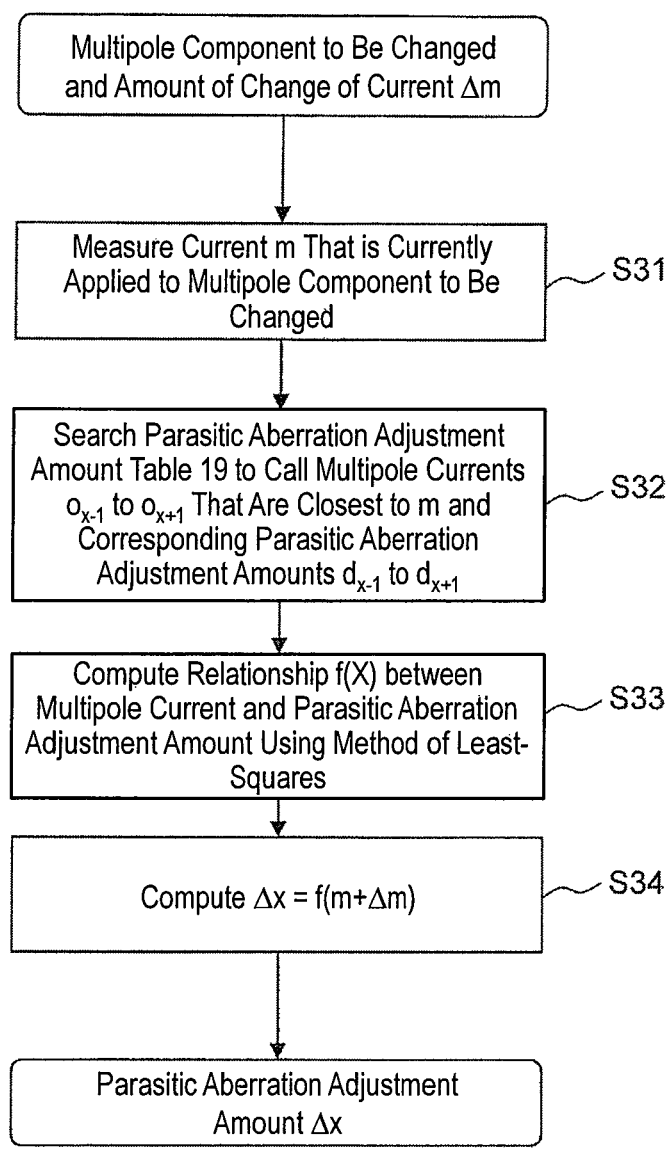
FIG. 3 is a flowchart showing exemplary procedures to compute the parasitic aberration adjustment amount in accordance with Embodiment 1.

FIG. 3 shows a summary of the procedures of a process to be executed by the parasitic aberration adjustment amount estimation unit 16 until when the amount of current that is necessary to adjust a parasitic aberration is determined. It should be noted that in the following description, the number of multipole components that are the aberration correction targets is assumed to be one to simplify the description. Specifically, the multipole component that is the correction target is assumed to be eight poles in the first stage of the aberration corrector 4. In this case, it is assumed that the parasitic aberration adjustment amount estimation unit 16 determines the amount of current for adjusting a parasitic dipole field.

The parasitic aberration adjustment amount estimation unit 16 receives the multipole component (i.e., eight poles in the first stage as described above) to be changed and the amount of change of current $\Delta m$ therefor as input values. Such values are provided by the aberration correction amount estimation unit 15.

First, the parasitic aberration adjustment amount estimation unit 16 refers to the aberration corrector power output value measurement unit 19, and acquires the measured value of the current value m that is currently applied to the eight poles in the first stage of the aberration corrector 4 (step S31).

Next, the parasitic aberration adjustment amount estimation unit 16 refers to the parasitic aberration adjustment amount table 18, and calls data to be used to determine the amount for adjusting a parasitic dipole field (step S32). The parasitic aberration adjustment amount table 18 has stored therein, for the multipole lens in each stage of the aberration corrector 4, the correspondence between the current value of the multipole component in the range of the device specifications and the parasitic aberration adjustment amount that is necessary for the current value, in a matrix data format. Needless to say, the data format is not limited to the matrix data format.

FIG. 4 shows an example of the parasitic aberration adjustment amount table 18. FIG. 4 shows the correspondence of current values $o_1$ to $o_n$ applied to each of the eight poles in the first stage of the aberration corrector 4 and parasitic aberration adjustment amounts (i.e., current values) $d_1$ to $d_n$ that are necessary to cancel out a parasitic dipole field that would be generated upon application of the respective current values. It should be noted that the current values $o_1$ to $o_n$ need not be data at regular intervals, and intervals between some pieces of data may be small or large only in some section. For example, when the current value of the eight poles that is required to suppress an aberration to a desired magnitude has been estimated through an experiment or simulation, it is possible to arrange a number of current values to be recorded on the table in an area around the estimated current value. In the parasitic aberration adjustment amount table 18, correspondence that has been acquired as the device characteristics data before the shipment of the device is stored and held.

Referring again to step S32 in FIG. 3, the parasitic aberration adjustment amount estimation unit 16 searches the parasitic aberration adjustment amount table 18 using the current value m that is currently applied to the eight poles in the first stage of the aberration corrector 4, and reads a correspondence in a row in which a value that is closest to the current value m is recorded. That is, the parasitic aberration adjustment amount estimation unit 16 calls the current value of the eight poles and the amount (i.e., current value) for adjusting a parasitic dipole field.

Next, the parasitic aberration adjustment amount estimation unit 16 similarly calls correspondences in some preceding and following rows of the row in which the current value of the eight poles that is closest to the current value m is recorded. The number of rows to be called from the parasitic aberration adjustment amount table 18 depends on what function is used to perform fitting of the correspondence. For example, in the case of linear fitting, three to five rows would be appropriate. In this embodiment, the values in three rows (i.e., currents of the eight poles: $o_{x-1}$, $o_x$, $o_{x+1}$ and corresponding currents for adjusting a parasitic dipole field: $d_{x-1}$, $d_x$, $d_{x+1}$) are selected and called by the parasitic aberration adjustment amount estimation unit 16. Besides, fitting with the use of a secondary function or any given function may also be performed.

Although the above example shows a case where adjacent three rows are called from the parasitic aberration adjustment amount table, the rows to be read are not necessarily limited to the adjacent rows. For example, the rows may be determined in accordance with the value of $\Delta m$. For example, some rows may be selected from a range in which the current o of the eight poles satisfies m−aΔm<o<m+aΔm (where a is a natural number).

The parasitic aberration adjustment amount estimation unit 16 executes linear fitting on the data of the rows, thereby determining a function f(x) representing the correspondence between the amount of change of current of the eight poles and the current for adjusting a parasitic dipole filed (step S33). In the linear fitting, a straight line that is most approximate to the data of the selected rows is determined using the method of least-squares. It should be noted that for the computation of the function f(x), polynomial interpolation may also be used instead of the method of least-squares.

Next, the parasitic aberration adjustment amount estimation unit 16 computes the amount of current for adjusting a parasitic dipole field using the determined function f(x) (step S34). Specifically, the parasitic aberration adjustment amount estimation unit 16 computes the amount of current Δx for adjusting a parasitic dipole field that is necessary to change the current applied to the eight poles in the first stage of the aberration corrector 4 from m to m+Δm. In other words, in this embodiment, in order to compute the amount of current Δx for adjusting a parasitic dipole field, information on a local area around the current value m, which is currently applied to the multiple poles, is used to determine the function f(x) that is most approximate to the correspondence, so that the amount of current Δx for adjusting a parasitic dipole filed in accordance with the present state of the aberration corrector 4 is actively and automatically computed. Therefore, even when an aberration corrector whose correspondence between the field intensity of the multiple poles and the parasitic aberration adjustment amount changes nonlinearly is used, it is possible to compute the parasitic aberration adjustment amount more appropriately than with the conventional art.

Figure 5:
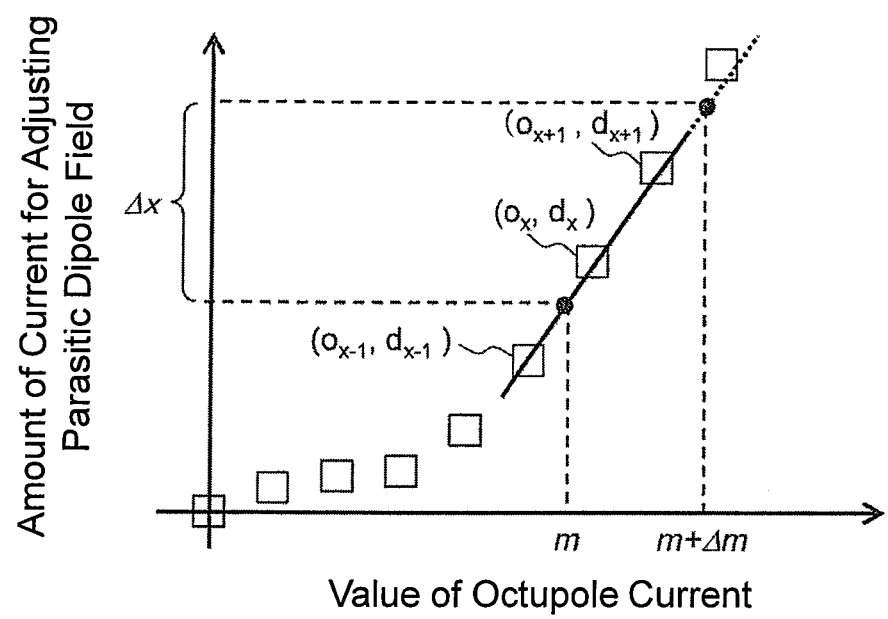
FIG. 5 is a diagram illustrating an exemplary method of computing the parasitic aberration adjustment amount in accordance with Embodiment 1.

FIG. 5 shows the computation principle of the parasitic aberration adjustment amount in accordance with this embodiment. FIG. 5 is a diagram obtained by plotting data of the parasitic aberration adjustment amount table 18 shown in FIG. 4 on a graph. The abscissa axis of FIG. 5 indicates the current value o of the eight poles and the ordinate axis indicates the current x for adjusting a parasitic dipole field. FIG. 5 represents a view of linear fitting that is performed when, provided that the current value of the eight poles that is currently applied to the aberration corrector 4 is m, the current value for correcting an aberration is changed from m→m+Δm.

As seen from FIG. 5, provided that the amount of current for adjusting a parasitic dipole field that is necessary to increase the current value m of the eight poles by Δm is Δx, Δx is estimated by performing linear fitting using only the values $o_{x-1}$, $o_x$, and $o_{x+1}$ at three points around the current value m to compute the amount of current Δx for adjusting a parasitic dipole field that is suitable for the relevant current value section. Suppose a case where linear fitting is performed using all data points of the parasitic aberration adjustment amount table 18. Then, it is easily predicted that the difference between the estimated value of the amount of current Δx for adjusting a parasitic dipole field and the actually needed amount of current Δx for adjusting a parasitic dipole field becomes greater.

[Conclusion]

As described above, in the SEM system in accordance with this embodiment, even when the correspondence between the field intensity of (i.e., the value of current applied to) the multiple poles of the aberration corrector 4 and the parasitic aberration adjustment amount changes nonlinearly, it is possible to determine an optimal parasitic aberration adjustment amount in accordance with the present value of the field intensity (i.e., the value of applied current) and the aberration correction amount and provide it to the aberration corrector 4. Accordingly, it becomes possible to more effectively suppress the amount of generation of parasitic aberrations that would be generated upon correction of aberrations than with the conventional devices.

Embodiment 2

System Configuration

Figure 6:
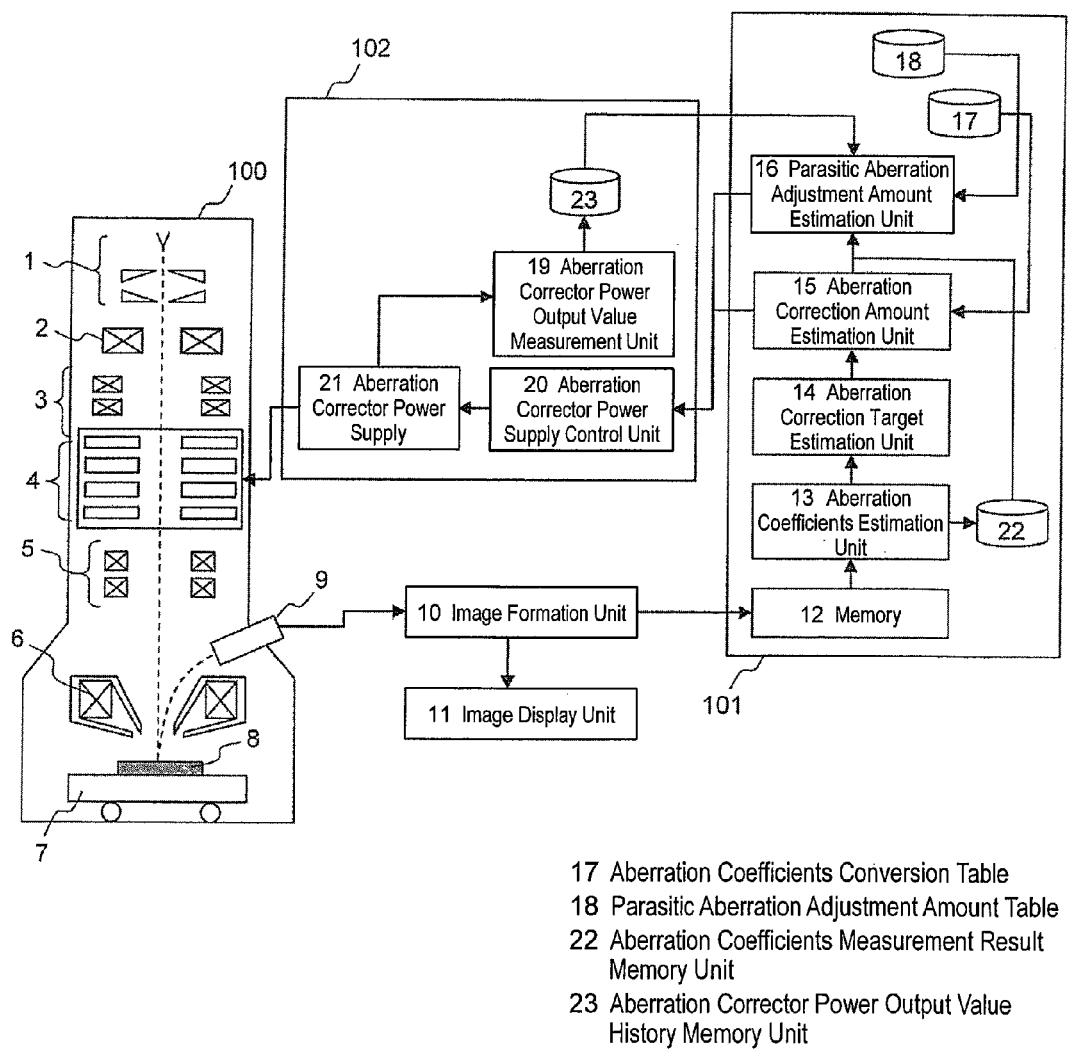
FIG. 6 is a diagram showing an exemplary configuration of a charged particle beam device system in accordance with Embodiment 2.

FIG. 6 shows the schematic configuration of a SEM system in accordance with Embodiment 2. In FIG. 6, portions corresponding to those in FIG. 1 are denoted by the same reference numerals. The SEM system in accordance with this embodiment also has mounted thereon a quadrupole to octopole electromagnetic field superimposed aberration corrector. As described below, the SEM system in accordance with this embodiment records a measurement history of the present value (i.e., power output value) of the multipole control amount provided to each of the multiple poles of the aberration corrector 4 and a measurement history of the aberration amount, and computes an optimal parasitic aberration adjustment amount at each point in time with reference to the measurement history.

Hereinafter, only points that differ from those in Embodiment 1 will be described. First, in this embodiment, the aberration coefficients estimation unit 13 has an aberration coefficients measurement result memory unit 22, and stores a history of the types of measured aberrations into the aberration coefficients measurement result memory unit 22. FIG. 7 shows an exemplary data structure of the aberration coefficients measurement result memory unit 22. The types of the stored aberrations include "axis deviation," "out-of-focus," "astigmatism," and "spherical aberration." Among them, the "axis deviation" and "out-of-focus" are parasitic deviations. It should be noted that the ordinal number of the aberration correction time is represented by a serial number in each row, and a measured aberration value is recorded only in the field of a type of an aberration modified in each execution time. Thus, no data or empty data is recorded in the field of a type of an aberration that was not measured. In this manner, the results of the measurement of aberration correction are recorded as matrix data in the aberration coefficients measurement result memory unit 22. In FIG. 7, the last time aberration correction was performed is N. Needless to say, the data format need not be such a matrix data format.

In this embodiment, the aberration corrector power supply system 102 includes an aberration corrector power output value history memory unit 23, and stores a history of the measured applied power output values into the aberration corrector power output value history memory unit 23. It should be noted that the history is stored into the aberration corrector power output value history memory unit 23 by the aberration corrector power output value measurement unit 19. The aberration corrector power output value measurement unit 19 measures the applied current each time the operation of changing the current of the multiple poles is performed, and stores the measurement history into the aberration corrector power output value history memory unit 23. FIG. 8 shows an exemplary data structure of the aberration corrector power output value history memory unit 23. The aberration corrector power output value history memory unit 23 records/holds the current of the multiple poles applied to each stage each time aberration correction was executed, for each stage of the aberration corrector 4. It should be noted that the ordinal number of the aberration correction time is represented by a serial number in each row, and an applied power output value that was modified in each execution time is recorded. For multiple poles to which no current was applied, zero is recorded. In this manner, the results of the measurement of the applied current are also recorded as matrix data on the aberration corrector power output value history memory unit 23. In FIG. 8, the last time aberration correction was performed is N. Needless to say, the data format need not be such a matrix data format.

The parasitic aberration adjustment amount estimation unit 16 in accordance with this embodiment also determines the multipole adjustment amount (e.g., current value or voltage value) for adjusting a parasitic aberration by referring to the aberration coefficients conversion table 17 in the initial correction time as in Embodiment 1. However, after the initial correction time, the parasitic aberration adjustment amount estimation unit 16 accesses the aberration coefficients measurement result memory unit 22 and the aberration corrector power output value history memory unit 23 to refer to the history of changes of current of each of the multiple poles as well as the history of parasitic aberrations generated thereby, and determines the next adjustment amount. The details of the method of determining the adjustment amount are described below.

[Summary of the Correction Operation]

Figure 9:
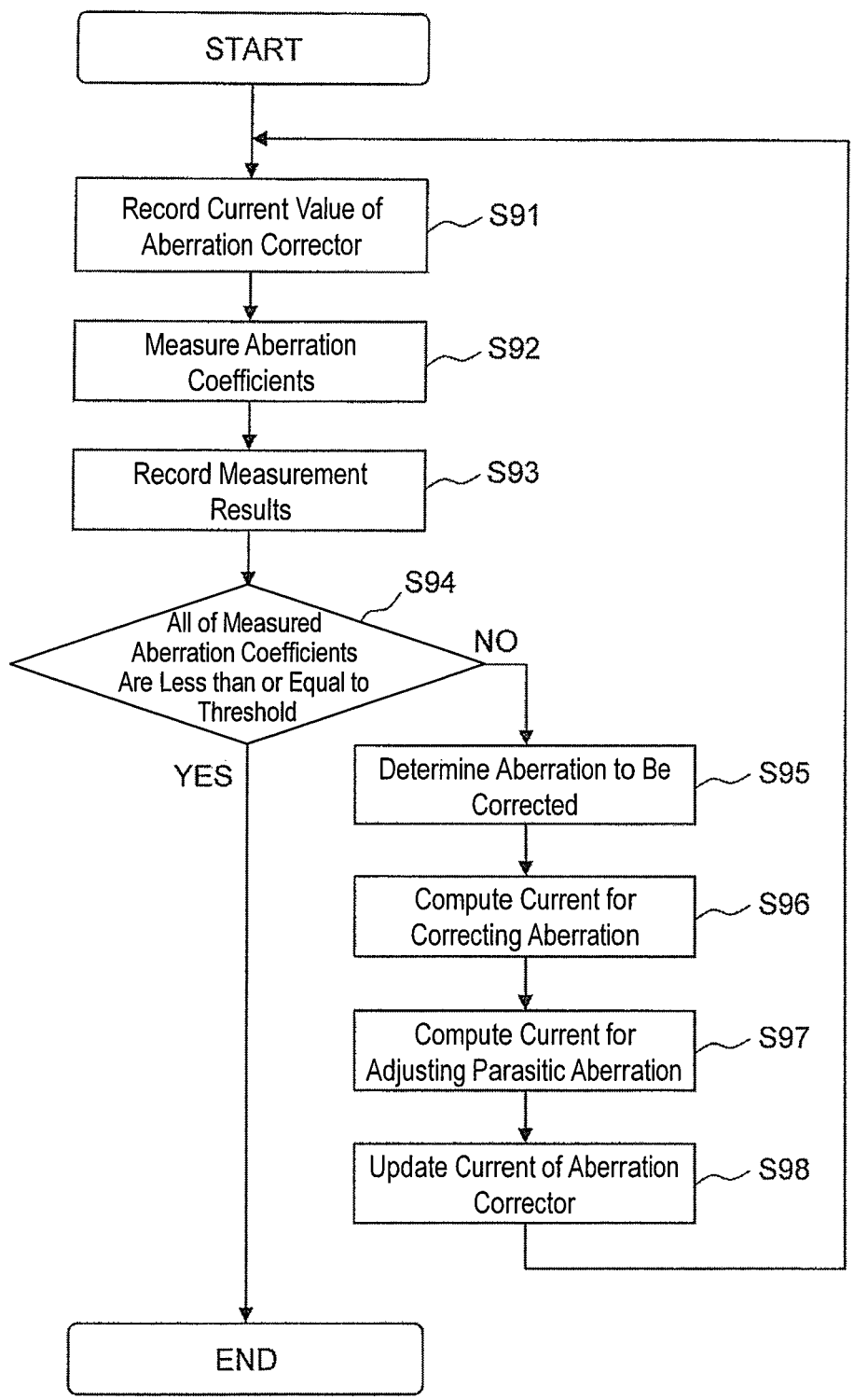
FIG. 9 is a flowchart showing exemplary procedures to compute aberration correction in accordance with Embodiment 2.

FIG. 9 shows exemplary procedures to correct aberrations in accordance with this embodiment. Hereinafter, the details of the correction operation in accordance with this embodiment will be described, centering on the points that differ from those in Embodiment 1. In the following description, it is also assumed that multiple poles are formed of magnetic poles and current is used to control the aberration corrector 4. Needless to say, even when multiple poles formed of electrodes are used, aberrations can be corrected through similar procedures.

In this embodiment, the present value of the current value applied to the aberration corrector 4 is measured before aberrations of the aberration corrector 4 are measured. The measurement is executed by the aberration corrector power output value measurement unit 19. The aberration corrector power output value measurement unit 19 records the measurement results on the aberration corrector power output value history memory unit 23 (step S91).

Next, an image is acquired in the SEM column 100, and the acquired image is stored in the memory 12 in the control computer 101. The aberration coefficients estimation unit 13 reads the image written in the memory 12, and computes aberration coefficients of the optical unit (step S92).

The aberration coefficients estimation unit 13 stores the measurement results into the aberration coefficients measurement result memory unit 22 (step S93). After that, the aberration correction target estimation unit 14 determines if the aberration correction has terminated (step S94). If a negative result is obtained, determination of a target aberration to be corrected by the corrector (step S95), computation of the amount of current for correcting the aberration (step S96), computation of the amount of current for adjusting a parasitic aberration (step S97), and update of the current of the aberration corrector 4 (step S98) are executed in the same way as in Embodiment 1.

[Adjustment of Parasitic Aberrations (Summary)]

The parasitic aberration adjustment amount estimation unit 16 in accordance with this embodiment computes the total value of (1) the parasitic aberration adjustment amount that is proportional to the amount of change of current $\Delta m$ applied to the multiple poles, (2) the cumulative total value of the parasitic aberration adjustment amounts so far, and (3) a parasitic aberration adjustment amount that is calculated on the basis of the change rate between the present value of the adjustment value applied to adjust an aberration that is to be adjusted next and the value immediately before the present value, and determines a final parasitic aberration adjustment amount $\Delta x$ on the basis of the total value. Such relationship is represented by the following computation formula.

[Math. 1]

$$\Delta x(\Delta m) = K_0 \Delta m + K_1 \sum_{i=0}^{N} f(m_i) + K_2 \frac{f(m_n) - f(m_{n-1})}{m_n - m_{n-1}} \quad \text{Formula (1)}$$

In Formula (1), symbol m indicates the current value applied to a given pole of the multiple poles, and the subscript indicates the number of corrections made to the current value applied to the given pole of the multiple poles. The number of corrections indicated by the subscript herein is counted independently of the types or number of the corrected aberrations. Thus, the number indicated by the subscript is not necessarily equal to the number of corrections made to each individual aberration. The function f(m) represents the amount of a parasitic aberration that is generated when the value of the current applied to the multiple poles is m. Symbols $K_0$ to $K_2$ represent constants that are determined experimentally. Symbol n represents the number of corrections counted for each type of aberration.

The first term of the right-hand side of Formula (1) represents that the parasitic aberration adjustment amount is given such that it is proportional to the amount of change of current $\Delta m$. The second term of the right-hand side represents that the parasitic aberration adjustment amount is given in accordance with the cumulative total value of the parasitic aberration adjustment amounts so far, that is, the adjustment current value for correcting parasitic aberrations that have remained so far without being corrected. The third term of the right-hand side represents that the parasitic aberration adjustment amount is given on the basis of the change rate between the present value of the adjustment value applied to adjust an aberration that is to be adjusted next and the value immediately before the present value.

The parasitic aberration adjustment amount estimation unit 16 computes the parasitic aberration adjustment amount in accordance with the status of each of the multiple poles of the aberration corrector 4 on the basis of Formula (1), and provides the result to the aberration corrector power supply control unit 20. The aberration corrector power supply control unit 20 causes the aberration corrector power supply 21 to generate current in accordance with the total value of the amount of change of current $\Delta m$ for correcting an aberration and the parasitic aberration adjustment amount $\Delta x$, and feeds back the generated current to the aberration corrector 4. Through repetition of such feedback, adjustment of parasitic aberrations of the aberration corrector 4 can always be executed accurately independently of changes of the characteristics of the magnetic poles with time.

[Adjustment of Parasitic Aberrations (Specific Example)]

Figure 10:
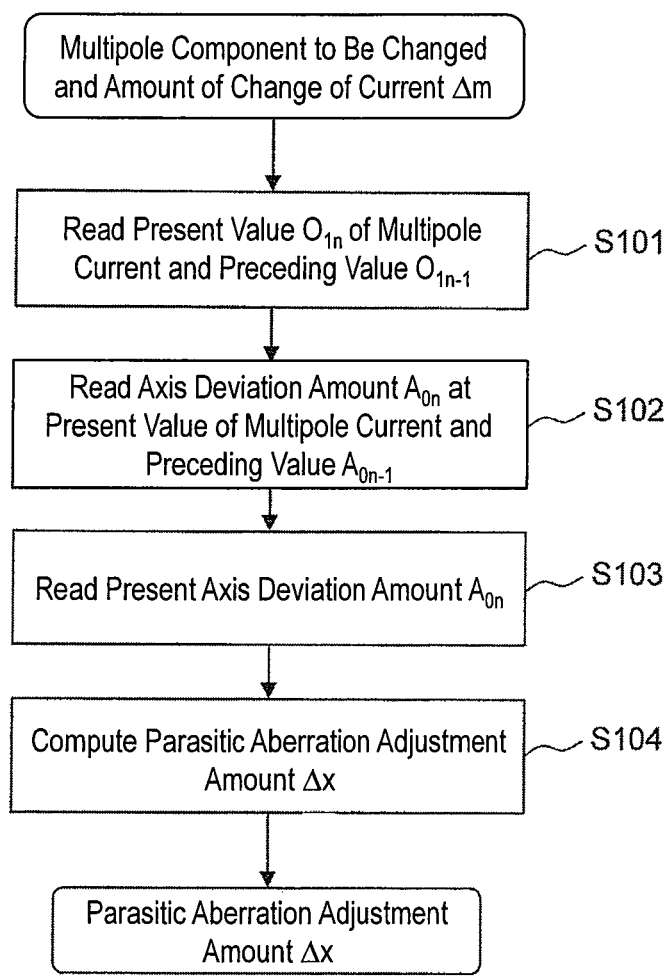
FIG. 10 is a flowchart showing exemplary procedures to compute a parasitic aberration adjustment amount in accordance with Embodiment 2.

FIG. 10 shows a specific example of the process of computing a parasitic aberration adjustment current executed in step S97 (FIG. 9). The parasitic aberration adjustment amount estimation unit 16 receives information on the multiple poles (i.e., eight poles in the first stage of the aberration corrector 4 in this embodiment) whose current value is to be changed at the next aberration correction time, and the amount of change of current Δm computed by the aberration correction amount estimation unit 15.

Next, the parasitic aberration adjustment amount estimation unit 16 refers to the aberration corrector power output value history memory unit 23, and refers to the latest current change history of the multipole components whose current value is to be changed from now. For example, provided that the present value of the ordinal number of the correction time is N, the parasitic aberration adjustment amount estimation unit 16 refers to a power history of the aberration corrector shown in FIG. 8, and searches for the last correction time when the current value applied to the eight poles has changed to the present value, and the corresponding current value. In the case of FIG. 8, the current value of the eight poles is changed from the value of the n−1-th correction time to the present value at the n-th correction time. That is, current of the eight poles was changed to the present current value $o_{1n}$ from the preceding current value $o_{1n-1}$. Thus, the parasitic aberration adjustment amount estimation unit 16 reads the current values $o_{1n-1}$ and $o_{1n}$ as the input data (step S101).

Next, the parasitic aberration adjustment amount estimation unit 16 refers to the aberration coefficients measurement result memory unit 22, and searches for how much the parasitic aberration has changed from the n−1-th correction time to the n-th correction time confirmed in step S101. In the case of FIG. 7, it is seen that the amount of axis deviation due to a parasitic dipole field measured at the n−1-th correction time is $A_{0n-1}$, while the amount of axis deviation due to a parasitic dipole field after the n-th correction time has changed to $A_{0n}$. Herein, the parasitic aberration adjustment amount estimation unit 16 reads the axis deviation amounts $A_{0n-1}$ and $A_{0n}$ as the input data (step S102). Symbol n is a subscript.

In addition, the axis deviation amount $A_{0N}$ due to the present parasitic dipole field, that is, a parasitic dipole field after the N-th correction time is read as the input data (step S103). It should be noted that the subscript is symbol N.

When the aforementioned input data is ready, the parasitic aberration adjustment amount estimation unit 16 computes the current value Δx for adjusting a parasitic dipole field, to be applied to the eight poles at the next (i.e., N+1-th) correction time (step S104). Herein, the current value is changed from $o_{1n}$ to $o_{1n+\Delta m}$ at the next correction time.

$$\Delta x = K_0 \Delta m + K_1 A_{0N} + K_2 \frac{A_{0n} - A_{0n-1}}{o_{1n} - o_{1n-1}} \quad \text{Formula (2)}$$

The aberration corrector power supply control unit 20 is provided with Δx and Δm. Although the axis deviation A has been described above, it is also possible to compute a current value that is necessary to adjust the out-of-focus C through similar procedures.

[Example of GUI]

Figure 11:
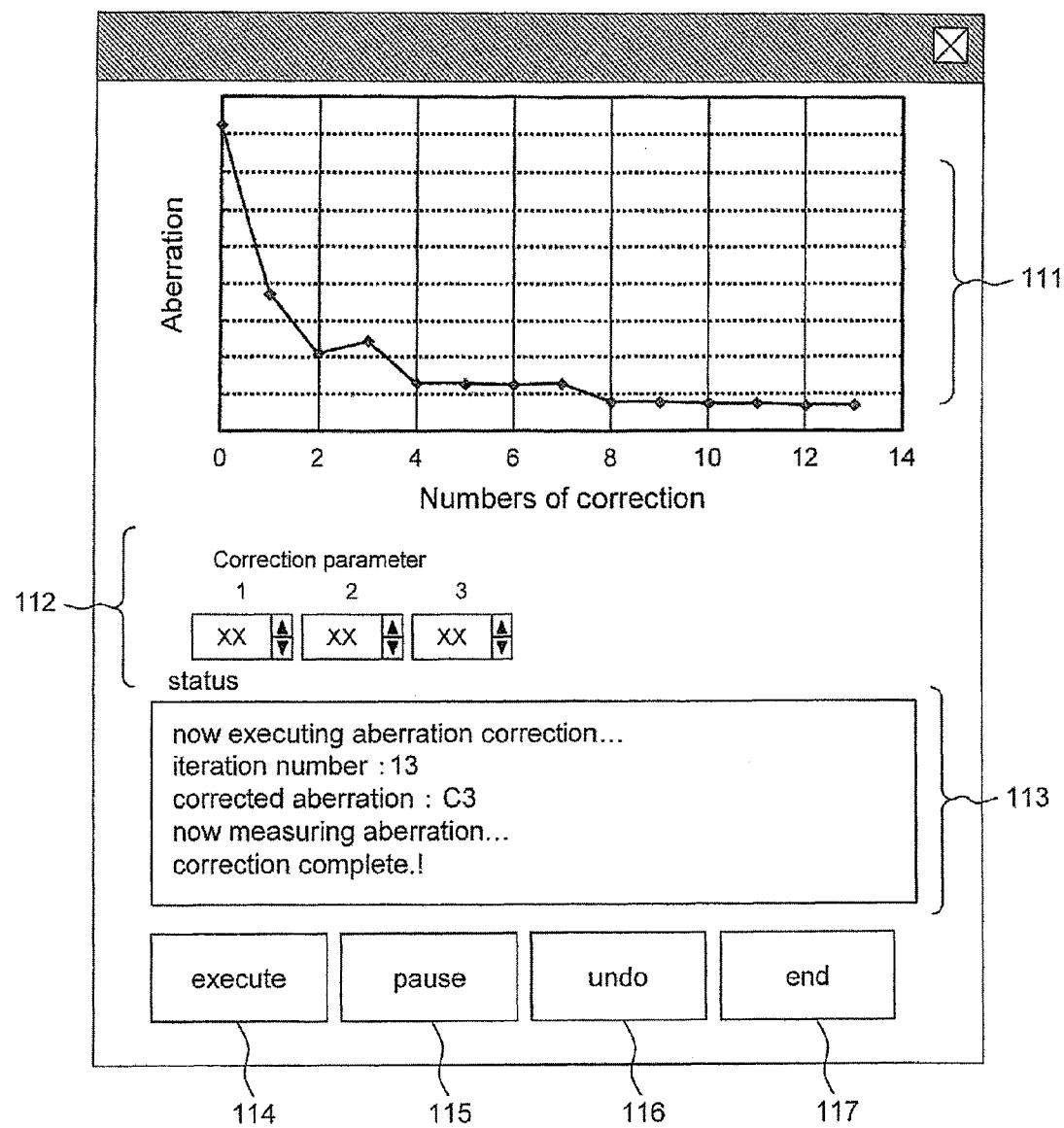
FIG. 11 is a diagram showing an exemplary user interface used in Embodiment 2.

FIG. 11 shows an exemplary GUI screen displayed on a display device (not shown) connected to the control computer 101. An operator is able to confirm the execution status of automatic aberration correction through the GUI screen. For example, the operator is able to confirm the correction status by referring to an aberration correction process display unit 111. In addition, the operator is able to adjust the constant parameters $K_0$ to $K_2$ of Formula (1) in accordance with the convergence state of the automatic correction by referring to an automatic aberration correction condition setting unit 112. Further, the operator is able to confirm the status of the details of the automatic correction that is currently performed by referring to a message display unit 113. Furthermore, the operator is also able to control the automatic correction operation by using an automatic correction start button 114, an automatic correction pause button 115, an automatic correction undo button 116, and an automatic correction stop button 117 that are arranged on the GUI screen.

In this embodiment, the value of the constant parameter $K_0$ may be experimentally determined in advance and recorded in the parasitic aberration adjustment amount table 18. However, the value of the constant parameter $K_0$ may also be determined each time the multiple poles are adjusted, in accordance with the method of Embodiment 1. Alternatively, the value of the constant parameter $K_0$ may also be adjusted individually by the operator in accordance with the state of parasitic aberrations.

[Conclusion]

The SEM system in accordance with this embodiment has stored therein a history of the amounts of current applied to the aberration corrector 4 and a history of aberrations. Thus, even when the characteristics of parasitic aberrations that appear in the aberration corrector 4 change with time, it is possible to automatically execute optimum adjustment in accordance with the status of the aberration corrector 4.

Since the SEM system in accordance with this embodiment stores a history of the amounts of current applied to the aberration corrector 4, even when adjustment of a parasitic aberration fails and it thus becomes difficult to continue the automatic correction, such that an image becomes difficult to see due to an axis deviation or the degree of out-of-focus has become significantly large as a result of changing the current of the multiple poles, it is still possible to suspend the automatic correction and return the current of the multiple poles to the state before the change (i.e., undo) at the discretion of the operator.

In addition, according to the SEM system in accordance with this embodiment, initial aberration correction is executed by referring to the value of the parasitic aberration adjustment amount table 18 set in advance, and also, the state of change of a parasitic aberration that occurs while the SEM system is used is reflected into the next adjustment of the aberration amount. Therefore, it is possible to reduce the influence of performance variations among SEM systems. The parasitic aberration adjustment amount table 18 in shipment of the device may be created using a single device at the device production site, for example, so that the parasitic aberration adjustment amount table 18 is used as the master data, and a parasitic aberration may be adjusted by modifying a performance variation from the master data using the method in accordance with this embodiment.

OTHER EMBODIMENTS

It should be noted that the present invention is not limited to the aforementioned embodiments, and includes a variety of variations. For example, although the aforementioned embodiments have been described in detail to clearly illustrate the present invention, the present invention need not include all of the structures described in the embodiments. It is possible to replace a part of a structure of an embodiment with a structure of another embodiment. In addition, it is also possible to add, to a structure of an embodiment, a structure of another embodiment. Further, it is also possible to, for a part of a structure of each embodiment, add/remove/substitute a structure of another embodiment.

The present invention has no restrictions on the method of measuring aberrations. Therefore, the present invention can also be applied to a case where an aberration corrector is mounted on other charged particle beam devices, for example, a transmission electron microscope, a scanning transmission electron microscope, or a focused ion beam system. In addition, the aberration corrector can also be applied to an aberration corrector that uses multiple stages of multiple poles, such as a hexapole aberration corrector, an electromagnetic field superimposed quadrupole to electric field octupole aberration corrector, an electromagnetic field superimposed quadrupole to magnetic field octupole aberration corrector, an all-stage electrostatic type aberration corrector, or an all-stage magnetic field type aberration corrector. In addition, in the present invention, aberrations to be corrected may be any of chromatic aberrations and geometrical aberrations.

Some or all of the aforementioned structures, functions, processing units, processing means, and the like may be designed as integrated circuits and thereby implemented by hardware, for example. Alternatively, each of the aforementioned structures, functions, and the like may be implemented through analysis and execution of a program whose function is performed by a processor. That is, each of the aforementioned structures, functions, and the like may be implemented through software processing. Information such as the program that implements each function, tables, and files can be stored in a storage device such as memory, a hard disk, or a SSD (Solid State Drive); or a storage medium such as an IC card, an SD card, or a DVD. In addition, the control lines and information lines represent those that are considered to be necessary for the description, and do not necessarily represent all control lines and information lines that are necessary for a product. Thus, in practice, almost all structures may be considered to be mutually connected.

REFERENCE SIGNS LIST

1 Electron gun
2 Condenser lens
3 Deflection coil
4 Aberration corrector
5 Scan coil
6 Objective lens
7 Sample stage
8 Sample
9 Detector
10 Image formation unit
11 Image display unit
12 Memory
13 Aberration coefficients estimation unit
14 Aberration correction target estimation unit
15 Aberration correction amount estimation unit
16 Parasitic aberration adjustment amount estimation unit
17 Aberration coefficients conversion table
18 Parasitic aberration adjustment amount table
19 Aberration corrector power output value measurement unit
20 Aberration corrector power supply control unit
21 Aberration corrector power supply
22 Aberration coefficients measurement result memory unit
23 Aberration corrector power output value history memory unit
100 SEM column
101 Control computer
102 Aberration corrector power supply system
111 Aberration correction process display unit
112 Automatic aberration correction condition setting unit
113 Message display unit
114 Automatic correction start button
115 Automatic correction pause button
116 Automatic correction undo button
117 Automatic correction stop button

The invention claimed is:

1. A charged particle beam device comprising:
a charged particle source configured to emit a charged particle beam;
a condenser lens configured to converge the charged particle beam;
an aberration corrector having multiple stages of multiple poles and configured to correct an aberration of an optical unit;
an aberration corrector power supply configured to generate power to be applied to the multiple poles according to the power supply control value;
an aberration coefficients estimation unit configured to measure a plurality of aberration coefficients of the optical unit when the power supply control value is applied to the multiple poles from the aberration corrector power supply;
an aberration correction target estimation unit configured to select an aberration coefficient from the plurality of aberration coefficients;
an aberration correction amount estimation unit that determines a multipole control value, of a current or a voltage, to correct the selected aberration coefficient based on the selected aberration coefficient;
an aberration corrector power output value measurement unit configured to measure the present value of the power supply control value applied to the multiple poles from the aberration corrector power supply;
a parasitic aberration adjustment amount estimation unit that determines a parasitic aberration adjustment amount based on the measured value of the power supply control value applied to the multiple poles and the multipole control value to adjust an aberration resulting from applying power corresponding to the multipole control value to the aberration corrector; and
an arithmetic device configured to compute a power supply control value for aberration correction to be applied to the multiple poles by adding the multipole control value to the parasitic aberration adjustment amount together,
wherein the parasitic aberration adjustment amount estimation unit stores and holds data that indicates a correspondence between the multipole control value and the parasitic aberration adjustment amount that is necessary to adjust a parasitic dipole field or a parasitic quadrupole field generated when power corresponding to the multipole control value is applied to the aberration corrector.

2. The charged particle beam device according to claim 1, wherein the parasitic aberration adjustment amount is for adjusting a parasitic dipole field or a parasitic quadrupole field generated due to an electrical and/or mechanical deviation of the aberration corrector.

3. The charged particle beam device according to claim 1, wherein the parasitic aberration adjustment amount estimation unit determines a function that is approximate to the correspondence in a range around the measured value of the power supply control value, and computes the parasitic aberration adjustment amount in accordance with the function.

4. The charged particle beam device according to claim 1, wherein the multiple poles in each of the multiple stages generate a non-rotationally symmetrical electric field and/or magnetic field.

5. The charged particle beam device according to claim 1, wherein the aberration correction amount estimation unit determines the multipole control value on the basis of an aberration coefficient measured for the optical unit before a power supply control value for aberration correction is applied to the multiple poles from the aberration corrector power supply.

6. A charged particle beam device comprising:
a charged particle source configured to emit a charged particle beam;
a condenser lens configured to converge the charged particle beam;
an aberration corrector having multiple stages of multiple poles and configured to correct an aberration of an optical unit;
an aberration corrector power supply configured to generate power to be applied to the multiple poles according to the power supply control value;
an aberration coefficients estimation unit configured to measure a plurality of aberration coefficients of the optical unit when the power supply control value is applied to the multiple poles from the aberration corrector power supply;
an aberration coefficients measurement result memory unit configured to record and store a measurement history of the aberration coefficients;
an aberration correction target estimation unit configured to select an aberration coefficient from the plurality of aberration coefficients;
an aberration correction amount estimation unit that determines a multipole control value, of a current or a voltage, to correct the selected aberration coefficient based on the selected aberration coefficient;
an aberration corrector power output value measurement unit configured to measure a present value of the power supply control value applied to the multiple poles from the aberration corrector power supply;
an aberration corrector power output value memory unit configured to record and store a measurement history of the power supply control value;
a parasitic aberration adjustment amount estimation unit configured to compute a parasitic aberration adjustment amount based on the measurement history of the aberration coefficient, the measurement history of the power supply control value, and the multipole control value, to adjust an aberration resulting from applying power corresponding to the multipole control value to the aberration corrector; and
an arithmetic device configured to compute, by adding the multipole control value and the parasitic aberration adjustment amount together, a power supply control value for aberration correction to be applied to the multiple poles.

7. The charged particle beam device according to claim 6, wherein the parasitic aberration adjustment amount estimation unit computes the parasitic aberration adjustment amount on the basis of:
(1) the multipole control value,
(2) a magnitude of a parasitic dipole field or a parasitic quadrupole field that remain in the optical unit,
(3) an amount of change of the power supply control value, which is applied to a field of the multiple poles to be adjusted next, from the power supply control value that was changed last time, and
(4) an amount of change of the parasitic dipole field or the parasitic quadrupole field that occurred, when the power supply control value applied to the field of the multiple poles to be adjusted next, was changed last time.

8. The charged particle beam device according to claim 6, wherein the multiple poles in each of the multiple stages generate a non-rotationally symmetrical electric field and/or magnetic field.

9. The charged particle beam device according to claim 6, wherein the arithmetic device displays an execution status of aberration correction on a screen.

10. The charged particle beam device according to claim 6,
wherein the aberration correction amount estimation unit determines the multipole control value on the basis of an aberration coefficient measured for the optical unit before a power supply control value for aberration correction is applied to the multiple poles from the aberration corrector power supply.

* * * * *